(12) United States Patent
Preu

(10) Patent No.: US 10,866,141 B2
(45) Date of Patent: Dec. 15, 2020

(54) DEVICE AND METHOD FOR SPECTRAL ANALYSIS

(71) Applicant: TECHNISCHE UNIVERSITÄT DARMSTADT, Darmstadt (DE)

(72) Inventor: Sascha Preu, Darmstadt (DE)

(73) Assignee: TECHNISCHE UNIVERSITAT DARMSTADT, Darmstadt (DE)

( * ) Notice: Subject to any disclaimer, the term of this patent is extended or adjusted under 35 U.S.C. 154(b) by 214 days.

(21) Appl. No.: 15/998,918

(22) PCT Filed: Feb. 7, 2017

(86) PCT No.: PCT/EP2017/052606
§ 371 (c)(1),
(2) Date: Aug. 16, 2018

(87) PCT Pub. No.: WO2017/140529
PCT Pub. Date: Aug. 24, 2017

(65) Prior Publication Data
US 2020/0025614 A1    Jan. 23, 2020

(30) Foreign Application Priority Data
Feb. 18, 2016   (DE) .................. 10 2016 102 818

(51) Int. Cl.
*G01J 3/42* (2006.01)
*G01J 9/04* (2006.01)
(Continued)

(52) U.S. Cl.
CPC . *G01J 3/42* (2013.01); *G01J 9/04* (2013.01); *G01R 23/165* (2013.01); *G01R 23/17* (2013.01)

(58) Field of Classification Search
CPC .. G01J 3/42; G01J 9/04; G01R 23/165; G01R 23/17
See application file for complete search history.

(56) References Cited

U.S. PATENT DOCUMENTS 4,650,330 A * 3/1987 Fujita ..................... G01J 9/04
356/489
4,695,792 A * 9/1987 Roy ....................... G01R 25/00
324/76.19
(Continued)

*Primary Examiner* — Hina F Ayub
(74) *Attorney, Agent, or Firm* — Burns & Levinson LLP; George Chaclas; Daniel McGrath

(57) ABSTRACT

The invention relates to a device for the spectral analysis of an electromagnetic measurement signal using an optoelectronic mixer, wherein the optoelectronic mixer is designed to generate the electrical superimposition signal by superimposing the electromagnetic measurement signal and a reference signal with at least one known frequency (fo). The device comprises the following features: a signal input for receiving an electrical superimposition signal from the optoelectronic mixer, a low-pass filter, a rectifier, and a read-out unit. The low-pass filter is designed to generate a filtered superimposition signal from the electrical superimposition signal by filtering out frequency portions above an upper cutoff frequency (fG). The rectifier is designed to generate a rectified superimposition signal from the filtered superimposition signal. The read-out unit is designed to determine a match of the known frequency (fo) of the reference signal with the electromagnetic measurement signal based on the rectified overlay signal.

14 Claims, 4 Drawing Sheets

(51) Int. Cl.
    *G01R 23/165*     (2006.01)
    *G01R 23/17*     (2006.01)

(56) References Cited

U.S. PATENT DOCUMENTS

| | | | | |
|---|---|---|---|---|
| 5,222,070 | A * | 6/1993 | Niki | H01S 5/0014 |
| | | | | 372/25 |
| 6,495,998 | B1 * | 12/2002 | Terreault | G01R 23/165 |
| | | | | 324/76.19 |
| 7,068,368 | B1 * | 6/2006 | Nagayoshi | G01N 21/27 |
| | | | | 209/577 |
| 2009/0303480 | A1 * | 12/2009 | Tamada | G01J 3/0205 |
| | | | | 356/369 |
| 2013/0107255 | A1 * | 5/2013 | Matsui | G01N 21/255 |
| | | | | 356/319 |
| 2013/0211218 | A1 * | 8/2013 | Suzuki | G01J 3/28 |
| | | | | 600/328 |
| 2020/0271515 | A1 * | 8/2020 | Roulston | G01J 3/4338 |

* cited by examiner

DEVICE AND METHOD FOR SPECTRAL ANALYSIS

CROSS REFERENCE TO RELATED APPLICATIONS

This application claims priority to and the benefit of Patent Application No. DE 10 2016 102 818.5 filed on Feb. 18, 2016 and International Patent Application No. PCT/EP2017/052606 filed Feb. 7, 2017, the contents of both of which are incorporated herein by reference as though fully set forth herein.

FIELD OF THE TECHNOLOGY

The subject technology relates to a device and a method for spectral analysis and in particular to a photonic continuous spectrum analyzer.

BACKGROUND

Spectrum analyzers are important instruments for characterizing electromagnetic sources or relevant emission or absorption properties of materials. The terahertz (THz) frequency range, which extends over frequencies in a range from, for example, 100 GHz to 10 THz or more, is of increasing interest. This spectral range in the electromagnetic spectrum between direct current and X-rays has only been insufficiently explored up to now.

On the other hand, THz spectrum analysis is used in many technical areas. There is, in particular, a need for the opportunity to characterize wide-band THz signals (for example from black bodies). It is additionally desirable to characterize frequency multiplier sequences regarding unwanted higher orders of multiplication. There is furthermore a need for measurements of the sideband suppression of THz sources. Beyond that, efficient THz spectroscopy is useful for detecting gases or other materials. Environmental protection requirements regarding certain gases in the atmosphere can, for example, be satisfied by way of THz spectroscopy. THz spectroscopy also plays an important role in astronomy. However, the spectral purity of known THz spectroscopy systems is less studied. One frequently relies on the fact that the spectral properties of the lasers or RF oscillators used for generating the THz wave are transferred directly and without modification to the THz signal by the conversion process. Another important application is mobile communication, which is increasingly evolving toward higher frequencies in the THz range. Spectral analyses for news transmissions via glass fiber lines are just as important. Lastly, THz spectroscopy can be used for security checks (for example at the airport).

So far there are unfortunately only a few costly approaches for realizing a spectrum analyzer for this frequency range.

A known system is based on frequency-multiplied network analyzers, which are so far essentially only used as spectral analyzers in scientific work because of their high acquisition costs. An alternative are photonic systems, which are based on frequency combs, i.e. short pulse lasers with a repeat rate of $f_{rep}$, which are firmly set to a stable frequency standard, such as for example an atomic clock or a hydrogen maser, whereby the mode spectrum of the laser is stabilized. Since only selected frequencies ($fn=fo+n*f_{rep}$, where n is an integer) are emitted with an interval in the repetition rate, a "comb" of frequencies is obtained, which can be downmixed in a photomixer. The photomixer can, for example, be implemented as a semiconductor component, which absorbs the laser radiation. The photomixer produces frequency differences of all lines by mixing and thus a frequency comb with a line interval of $f_{rep}$ in the terahertz range. It is possible to create many terahertz frequencies via a suitable choice of the repetition frequency as well as a sufficiently broad mode spectrum of the laser.

This signal serves as a local oscillator and is mixed with the radiation that is to be analyzed in a terahertz detector. A low-frequency beat (in the radio frequency range) at the frequency difference between the signal and the terahertz frequency comb results from the mixing process. This procedure is also known as downmixing to frequencies of the order of magnitude of $f_{rep}$. The beat can subsequently be evaluated with a radiofrequency (RF) spectral analyzer, so that a characterization of the line width becomes possible. For accurate frequency analysis, the measurement can be repeated with a second pulse repeat rate $f_{rep}'$, in order to determine with which line of the terahertz frequency comb the downmixing took place.

While this technology is indeed very accurate and allows for a characterization of extremely narrow-band sources, signals whose spectral width is greater than $f_{rep}$ cannot be characterized, since they outshine the free spectral range of the comb beats. The conversion of frequency combs to spectral analyzers is moreover very time-consuming and cost-intensive.

There is therefore a need for alternative opportunities to perform a spectral analysis in the terahertz range economically.

SUMMARY

The aforesaid task is accomplished by means of a device for spectral analysis according to Claim 1 and a method for spectral analysis according to Claim 13. The dependent claims refer to further advantageous embodiments of the objects of Claim 1 and Claim 13.

The subject technology relates to a device for spectral analysis of an electromagnetic measurement signal using a mixer or an optoelectronic mixer or a photomixer, e.g. a photoconductor. An optoelectronic mixer can be regarded as a mixer that downmixes an optical or electromagnetic signal with a THz signal to a lower frequency. The optoelectronic mixer is designed to produce an electrical override signal by superimposing the electromagnetic measurement signal and a reference signal (e.g. an optical signal) with at least one known frequency. The device comprises the following features: a signal input for receiving the electrical superposition signal from the optoelectronic mixer and a low-pass filter, which are designed to create a filtered superposition signal from the electrical superposition signal by filtering out frequency components above an upper cutoff frequency. The device furthermore comprises a rectifier, which is designed to generate a rectified superposition signal from the filtered superposition signal, and a read-out unit, which is designed to determine the correspondence of the known frequency of the reference signal with the electromagnetic measurement signal based on the rectified superposition signal.

In the context of the subject technology, the term "correspondence" is not necessarily intended to mean precise equality. Tolerances of the magnitude of the bandwidth of the low-pass filter can instead be accepted in determining the correspondence tolerances.

The term rectifier is also to comprise any component that has a rectifying property. This not only includes various diodes, but also precision rectifiers or operational amplifier circuits, which also perform rectification. It is in particular possible to use those rectifiers which display the non-linearities known to exist in the characteristic curve of diodes (e.g. a current strength-dependent forward voltage)—or at least not in the THz frequency range, as precision rectifies. If high frequency diodes (e.g. Schottky diodes) are used without operational amplifiers or operational amplifiers with low amplification, the concept of the subject technology functions as a power measuring device (instead of measuring the THz field strength), since there is no linearity in the power range of interest here (the operating point lies outside of the linear range).

The optoelectronic mixer, which is not necessarily part of the spectral analysis device, particularly produces a signal with a frequency that is equal to the difference between the frequency of the reference signal and the frequency of the electromagnetic measurement signal as an electrical superposition signal. The reference signal can itself be a difference signal, i.e. it can be produced via a superposition of two example laser signals, so that the difference between these two frequencies can be used for the spectral analysis.

The specified device makes it possible to determine via the rectifier whether a certain frequency of the electromagnetic measurement signal (or a fraction of the frequency of the measurement signal) lies within the frequency band of the low-pass filter or whether only noise is present in the frequency band selected by the low-pass filter. With the rectifier, the effect of an unknown phase relation can be eliminated, so that a signal can be read out accurately regardless of the phase relation of the individual signals.

The entire spectrum of the measurement signal can in addition be traversed via a targeted change of the frequency of the reference signal. Since the reference signal frequency is known, it is thus possible to determine the spectrum of the electromagnetic measurement signal by varying the reference signal frequency along with low-pass filtering. The rectifier and the read-out unit can then determine both a detection signal (confirmation of the presence of a certain frequency) and the respective intensity of this frequency range.

In other example embodiments, the device furthermore comprises an amplifier so as to amplify the electrical superposition signal and/or the filtered superposition signal and/or the rectified superposition signal.

In other example embodiments, the amplifier has a lower level of amplification for signals with frequencies above the critical frequency, so that the low-pass filter can be part of the amplifier. If the gain of the amplifier is frequency-dependent, the low-pass filter does not necessarily need to be a separate component. The amplifier can for example only amplify frequencies in a certain frequency range, so that there is no amplification above this frequency range and it thus effectively acts as a low-pass filter.

In other example embodiments, the low-pass filter is configured to change the cutoff frequency in response to a control signal. This example embodiment offers the benefit that an appropriate wide-band low-pass filter can at first perform a rough spectral analysis of the electromagnetic measurement signal. The low-pass filter can thereafter be selected to be correspondingly narrow, so that a fine analysis of the frequency component in the electromagnetic measurement signal becomes possible.

In other example embodiments, the device furthermore comprises a lock-in amplifier and/or a modulator (e.g. a chopper) for modulating the reference signal (or a part thereof) with a signal of known frequency and/or phase. The read-out unit can be designed to perform the detection on the resulting electrical superposition signal based on the lock-in technology. In other example embodiments, the electromagnetic measurement signal can also be modulated with a known signal in order to allow a certain frequency component to be amplified in a targeted way by using a lock-in amplifier.

In other example embodiments, the device additionally comprises a high-pass filter, which is designed to filter out frequency components of the electrical superposition signal, which lie below a lower cutoff frequency, with the high-pass filter being located along a signal path before the rectifier. This example embodiment offers the advantage that low frequency noise (e.g. 1/f noise) and/or unwanted direct current signals can be filtered in a targeted way.

In other example embodiments, the upper cutoff frequency of the low-pass filter depends on the line width of the reference signal and/or is specified thereby (with an example tolerance width of ±10% or ±50%).

The subject technology also concerns a spectrum analyzer for an electromagnetic measurement signal, where the spectrum analyzer comprises a reference signal source with the aforesaid properties, one of the aforesaid optoelectronic mixers and one of the aforesaid devices.

In other example embodiments, the spectrum analyzer comprises: a laser source, which is designed to produce a continuous signal with a first frequency and a second continuous signal with a second frequency and to combine them in the reference signal. The spectrum analyzer furthermore comprises an optoelectronic mixer, which is designed to produce an electrical superposition signal via the superposition of the electromagnetic measurement signal and the reference signal. The spectrum analyzer lastly comprises one of the aforesaid devices. The known frequency of the reference signal corresponds, for example, to the difference between the first frequency and the second frequency or can correspond with the difference between the first frequency and the second frequency up to a known detuning level. The overlay of the two laser signals results, for example, from an addition (superposition) of the two signals.

It is assured by way of the mixing with the reference signal and the low-pass filtering that only frequencies which correspond with the reference frequency and/or differ at most by the frequency defined by the low-pass filter can be measured.

In other example embodiments, the laser source is tunable in order to modify the first frequency and/or the second frequency in a predetermined range, with the predetermined range in particular extending from frequencies of 0 to 10 THz. The first laser signal and/or the second laser signal are, for example, tunable in such a way that a frequency difference between the first laser signal and the second laser signal lies in a range extending up to 10 THz (or more).

In other example embodiments, the first laser signal and/or the second laser signal encompasses a wavelength within a range between 500 nm and 1700 nm.

In other example embodiments, the optoelectronic mixer comprises opposite finger contacts, which form a finger contact electrode structure, it being possible to establish a (maximum) distance between the finger contacts of less than 20 µm. The electrical superposition signal can be accessed from the opposite finger contacts. To accomplish this, it is for example possible to apply a voltage to the finger contacts so that the current flow depends on the electromagnetic measurement signal and the reference signal because of the radiation-dependent change of conductivity. It is self-understood that the finger contact electrode structure only represents an example. In other example embodiments, the contacting can be also be implemented by way of different electrode shapes. Different photoconductor types (e.g. plasmonic photoconductors) or other designs of optoelectronic mixers can furthermore be used.

In other example embodiments, the optoelectronic mixer comprises an antenna for receiving the electromagnetic measurement signal and/or a lens for focusing the electromagnetic measurement signal.

In other example embodiments, the laser source for the generating of the first laser signal and the second laser signal is a multimode laser source. Both visual signals can be thus created by only one source.

The subject technology also concerns a method for the spectral analysis of an electromagnetic measurement signal using optoelectronic mixers. The optoelectronic mixer is designed to produce the electrical superposition signal superimposing the electromagnetic measurement signal and a reference signal with at least one known frequency. This method comprises the following steps: receipt of an electrical superposition signal from the optoelectronic mixer, creation of a filtered superposition signal from the electrical superposition signal by low-pass filtering in order to filter out frequency components above an upper cutoff frequency. The method additionally comprises the creation of a rectified superposition signal by rectifying the filtered superposition signal and the determination of the correspondence of the known frequency of the reference signal with the electromagnetic measurement signal. The last step can take place by detecting a DC voltage signal in the rectified superposition signal.

In other example embodiments, the reference signal is a beat of two laser signals, produced by one or more laser sources, and the method further comprises: tuning at least one of the laser sources to a frequency of a part of the superposition signal below the cutoff frequency of the low-pass filter, and determining that the electromagnetic measurement signal has this frequency.

Example embodiments of the subject technology thus fulfill the aforesaid technical task by using optoelectronic mixers for mixing a reference signal in the terahertz range and the measurement signal that is to be investigated, with a connecting low-pass filter with, as an example, a cutoff frequency within the range of the line width of the reference signal sources (for example a few MHz) selecting a frequency range to be investigated near the frequency of the beat. The subsequent rectifier produces a DC voltage component which eliminates the effect of an unknown phase. A signal can thus be read out regardless of the phase of the individual signals exactly when the measurement signal to be measured has a frequency in the frequency range made available by the low-pass filter.

In comparison with conventional spectrum analyzers, the example embodiments of the subject technology offer benefits not based on conventional frequency comb studies. Comparatively complex, pulsed systems set to a frequency standard are therefore not required. In addition, in accordance with the subject technology, no terahertz radiation source is required. Example embodiments of the subject technology are based on economical continuous wave laser sources and only one photomixer. This simplifies the construction and can be configured in an economical manner. A local oscillator is hardly required. The laser signals are instead mixed directly in the photomixer to thus create a low-frequency signal. While this mixture serves directly as a local oscillator, no terahertz signal needs to be created separately. The result of the mixing is moreover preclusively rectified and measured directly, without having to determine the spectrum at an intermediate frequency. Other advantages of the subject technology are that continuous wave lasers are tunable over a broad range, are economical, and the design of spectrum analyzer is generally compatible with that of conventional photomixing systems.

SHORT DESCRIPTION OF THE FIGURES

The example embodiments of the subject technology are better understood by way of the following detailed description and the attached drawings of the different example embodiments, which should however not be understood as limiting the disclosure to these specific embodiments, but rather merely serve the purpose of explaining and understanding the subject technology.

DETAILED DESCRIPTION

Example embodiments of the subject technology serve the purpose of analyzing an electromagnetic measurement signal with an unknown spectrum, which can contain one or more unknown frequencies.

Figure 1:
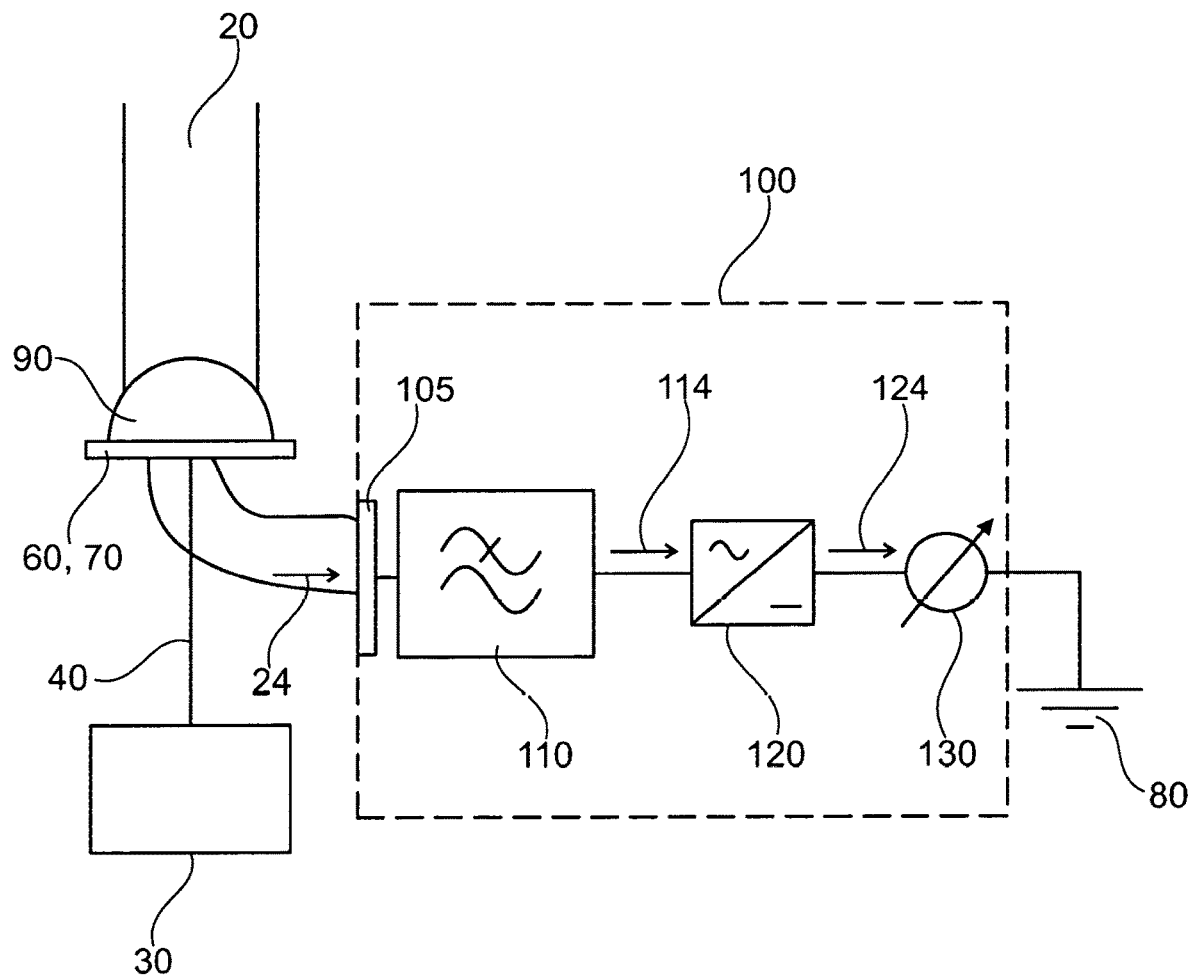
FIG. 1 shows a device for the spectral analysis of the electromagnetic measurement signal in accordance with an example embodiment of the subject technology.

FIG. 1 shows such a device 100, which is suitable for the spectral analysis of the electromagnetic measurement signal 20 by using of a photoconductor 60 (as an example of an optoelectronic mixer). The photoconductor 60 is designed to produce an electrical superposition signal 24 through a superposition of the electromagnetic measurement signal 20 and an optical reference signal 40, with the reference signal having at least one known frequency.

The device 100 has the following characteristics: a signal input 105, a low-pass filter 110, a rectifier 120 and a read-out unit 130. The signal input 105 is designed to receive the electrical superposition signal 24 from the photoconductor 60. The low-pass filter 110 is designed to produce a filtered superposition signal 114 from the electrical superposition signal 24 by filtering out frequency components above an upper cutoff frequency. The rectifier 120 is designed to create a rectified superposition signal 124 from that filtered superposition signal 114. The read-out unit 130 is designed to determine a correspondence of the known frequency of the reference signal 40 with the electromagnetic measurement signal 20 based on the rectified superposition signal 124.

The device 100 can additionally be grounded via a ground connection 80, so that relevant voltages can be measured with respect to ground.

The signal input 105 receives the electrical superposition signal 24 from the photoconductor 60, for example via relevant electrical lines. The photoconductor 60 is, for example, designed to receive the electromagnetic measurement signal 20 on one side and the reference signal 40 on the other side. The reference signal 40 is, for example, produced by a source (reference radiation source) 30, but it can be created by superimposing several optical signals from different sources. The source 30, which is not necessarily part of the spectral analysis device 100, can for instance comprise one or more laser sources or a multi-mode laser, which outputs a superposition of one or more laser signals as a reference signal 40.

A photoconductor is also known as a photoresistor and changes its electrical resistance depending on the incident electromagnetic radiation. It often consists of a semiconductor material in which incident electromagnetic radiation creates electron-hole pairs and thereby changes the conductivity. A superposition of the individual signals occurs when different radiation sources irradiate the photoconductor. The reference signal 40 is for example superimposed in the photoconductor 60 with the measurement signal 20 and an electrical superposition signal 24 is output to the device 100.

It is advantageous if the photoconductor 60 reacts sufficiently quickly to changes of the irradiating spectrum so as to thus also capture high frequency signals. The photoconductor 60 can therefore be characterized by the fact that it has a charge carrier lifetime of less than 500 ps or less than 100 ps or less than 50 ps or less than 1 ps. The photoconductor 60 can additionally comprise an antenna 70, which is designed to receive the electromagnetic measurement signal 20 as efficiently as possible. The photoconductor 60 can optionally also comprise a lens 90, which is designed to bundle the electromagnetic measurement signal and direct it toward a sensitive region of the photoconductor.

Figure 2:
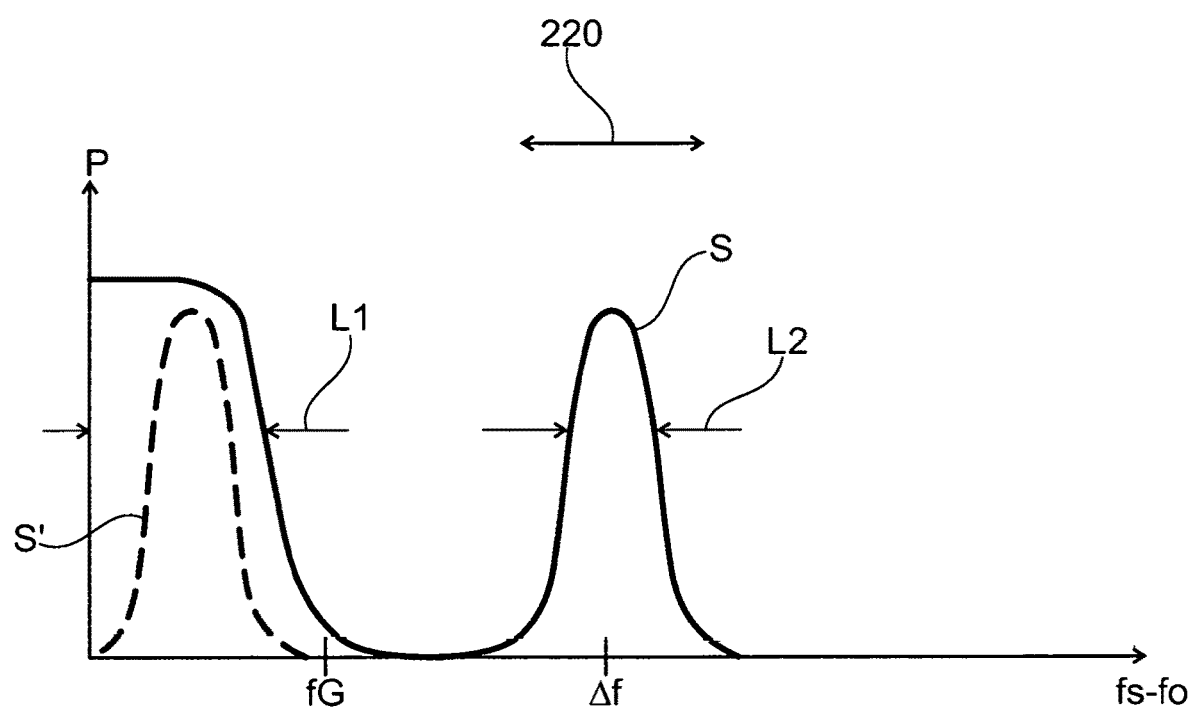
FIG. 2 illustrates the measurement principle for determining a spectrum of the electromagnetic measurement signal.

FIG. 2 portrays the measurement principle for determining whether a certain frequency or a certain frequency range is present in the electromagnetic measurement signal 20 or not. A spectral signal power P for a part S of the superposition signal 24 with a center frequency $\Delta f$ and a line width $L_2$ is represented, where the center frequency $\Delta f = fs - fo$ is the difference between the frequency of the electromagnetic measurement signal 24 and the reference signal frequency fo. Since the reference signal and its frequency fo are known, an analysis of the electromagnetic measurement signal 20 is performed via an analysis of the part S. Only a part of S is shown for the sake of simplicity, but the superposition signal 24 generally has additional frequency components. As stated before, several frequencies are additionally superimposed in the superposition signal 24: a reference signal frequency fo and the frequency fs of the measurement signal 20 that is to be studied, with the device of FIG. 1 being particularly sensitive to the frequency differences: fs−fo. The spectral frequency sum share has a very high frequency that does not need to be captured by the system.

The unknown frequency fs of the measurement signal 20 can be determined by the device 100 as follows.

The low-pass filter 110 first filters a frequency component lying below a cutoff frequency fG from the superposition signal 24. For example, if the part of S has a frequency $\Delta f > fG$, the low-pass filter 110 will filter out this part of S. The filtered signal 114 then always comprises the always present noise.

To determine the frequency fs (=$\Delta f + fo$) of the measurement signal 20, the reference radiation source 30 can be detuned so that fo and thus the frequency $\Delta f$ of the superposition signal 24 changes accordingly. This movement of the part of S in the frequency range is represented by the double arrow 220. Because of the detuning of the reference radiation source 30, the part S of the superposition signal 24 thus wanders in the frequency range either to higher or to lower frequencies—depending on whether the reference signal frequency fo comes close to the frequency fs of the measurement signal or gets further away from it.

If, as a consequence of this tuning, the frequency $\Delta f$ of the part S' is located within the frequency band of the width $L_1$ ($\Delta f < fG$) provided by the low-pass filter 110, the corresponding measurement signal S' is output as a filtered signal 114 and the read-out unit 130 can produce a corresponding detection signal. This detection signal indicates that the electromagnetic measurement signal 20 has a frequency fs, which is (approximately) equal to the known reference signal frequency fo, in fact up to an accuracy defined by the cutoff frequency fG or the bandwidth of the low-pass filter 110. In order to achieve an accuracy that is as high as possible, it is, for example, possible to adjust the line width of the reference signal and the bandwidth $L_1$ of the low-pass filter 110. If the width $L_1$ of the low-pass filter is selected to be small (for example of the order of magnitude of the line width of the reference signal source), it can thus be determined by simply detecting a discrete signal that the electromagnetic measurement signal 24 has a frequency component (or a spectral line) with a center frequency fo.

Figure 3:
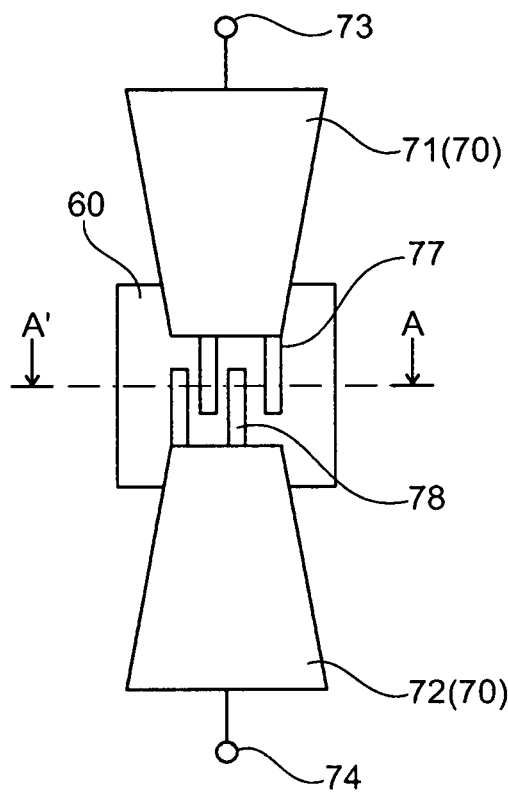
FIG. 3 shows further details of the photoconductor.
Figure 3:
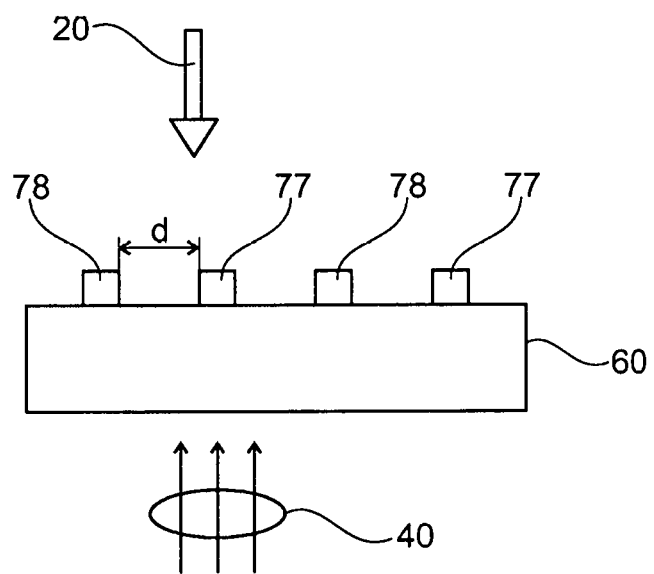

FIG. 3 shows additional details of an example photoconductor 60 and an optional antenna 70. The antenna 70 has a first section 71 and a second section 72, which respectively widen trapezoidally toward a first connector 73 and a second connector 74. The first section 71 has a first finger contact structure with several fingers at the shorter trapezoid side. The second section 72 likewise has a second finger contact structure 78 with several fingers at the shorter side of the trapezoid. The finger contacts 77, 78 extend into each other with a minimum distance d (see FIG. 3, bottom) and are formed along with the first antenna section 71 and the second antenna section 72, at least in part, on a semiconductor substrate, which constitutes the photoconductor 60. The antenna shapes are not trapezoidal in other example embodiments. It is self-understood that the invention is not to be limited to the tapered shape shown.

The bottom of FIG. 3 shows a cross-sectional view along the cross-sectional line A'-A, which passes through the semiconductor material of the photoconductor 60 and on the surface of which the first finger structure 77 and the second finger structure 78 extend. The maximum distance d between the fingers of the first finger structure 77 and the fingers of the second finger structure 78 can, for example, be selected so that the signal detection is as efficient as possible. This distance d can, for example, be <20 µm (or d<100 µm or d<50 µm or d<10 µm).

The reference signal 40 in the illustrated example embodiment irradiates the semiconductor substrate of the photoconductor 60 from the front, while the electromagnetic measurement signal 20 which is to be measured is, for instance, directed toward the back side (i.e. to the side opposite the electrode finger structures 77, 78). However, the direction of irradiation and/or the angle of irradiation can be selected to be different in other example embodiments.

The example embodiments shown have a relatively simple structure, which can be implemented economically based on commercially available components. This constitutes a significant advantage of the subject technology compared with known systems. Tuning of the reference signal source 30 furthermore allows for the frequency response (sweep oscillator) to be measured. If, for example, the electromagnetic measurement signal 20 has multiple lines in its spectrum (or has a continuous spectrum), the lines are successively detected as signals by tuning the reference signal source 30 (if the line gets to the pass band of the low-pass filter 110). A frequency line in the electromagnetic measurement signal 20 can be assigned to each detuning level of the reference signal source 30 (i.e. of a known frequency).

As stated previously, the reference signal 40 can be an overlay (beat) of signals from two example laser sources, which can respectively be in a wavelength range between 500 and 1700 nm (or between 400 nm and 3000 nm), so that a difference frequency between the two laser beams in the terahertz range, which can be used for the present measurement, arises from the superposition. Other example embodiments are, for example, based on a modified continuous wave terahertz system with two continuous wave lasers (for example two so-called DFB lasers; DFB=Distributed Feedback Laser), i.e. continuous wave laser technology is used for generating the reference signal 40. The frequency analysis for this system can be accomplished as follows.

It is, for example, possible to superimpose laser signals from two laser sources, whose frequencies $$f_1, f_2 = f_1 + f_s + \Delta f$$

are detuned by the measurement signal $f_s$ to be detected in the terahertz range, except for a small deviation $\Delta f$. The deviation $\Delta f$ can be set deliberately by the detuning of the laser source(s). A beat in the visual signal results from the overlay of the two laser signals at a frequency difference in accordance with:

$$P_L = 0.5 * P_0 * (1 + \cos \omega_{Lo} t),$$

where $\omega_{Lo} = 2\pi(f_2 - f_1)$. The mixed laser signal subsequently irradiates the photoconductor 60 and thereby modulates its conductivity in accordance with:

$$\sigma \sim P_L = 0.5 * P_0 * (1 + \cos \omega_{Lo} t).$$

The photoconductor 60 additionally receives the measurement signal 20, which is to be studied and has a frequency fs, by way of its antenna 70, which couples to the semiconductor substrate. For improved coupling, the photoconductor 60 can, in accordance with other example embodiments, have a lens 90 (e.g. a silicon lens) or similar visual components, which for example serve the purpose of bundling the electromagnetic measurement signal 20. The received measurement signal 20 is thus converted into a potential, whose voltage is proportional to the received electromagnetic field strength, with the following applying:

$$U_{THz} \sim E_{THz} * \cos(\omega_s t + \varphi),$$

where $\omega_s = 2\pi f_s$ and $\varphi$ is any phase.

Since both signals are input to the photoconductor 60, a current according to the following formula results:

$$I \sim U_{THz} * \sigma \sim 0.5 * P_0 * E_{THz} * (1 + \cos \omega_{Lo} t) * \cos(\omega_s t + \varphi).$$

Apart from the terahertz component, this current also has a component at the frequency difference between the terahertz beat of the optical signal and the frequency of the measurement signal to be characterized $$\Delta f = |f_{Lo} - f_s|$$

where $f_{Lo} = f_1 - f_2$ (corresponding to the previously defined fo), which oscillates with $$I_{IF} \sim E_{THz} * \cos(2\pi \Delta f t + \varphi).$$

If both frequency components lie very close to one another, the resulting frequency component $\Delta f$ is a very low frequency and can generally be read out with an RF spectrum analyzer. For example, if the frequency fs of the signal is unknown, it cannot be ensured that the frequency range $\Delta f$ lies in the measurement range of the RF spectrum analyzer. The frequency difference of the lasers must consequently be detuned in order to analyze another frequency range and to again record an RF spectrum. This would have to be iterated for the entire THz range and the resulting spectra would have to be assembled. But a spectrum analyzer requires a certain amount of time to record an RF spectrum, so that the required measurement time can become very long.

This procedure is complex and error-prone because of the many steps. It is much simpler if, as in the subject technology, only one signal were to be analyzed and if it only were necessary to pass through the frequency difference of the lasers. The relative phase φ between the beat on the laser signal and the THz signal is unfortunately not constant since both signals (the optical laser signal and the measurement signal) are incoherent with respect to one another. The phase φ thus fluctuates randomly, so that no simple DC component that can be read easily arises.

In accordance with example embodiments, the DC component can be created by the device 100 as follows (also see the description relating to FIG. 2).

An optional high-pass filter with a relatively low-pass frequency (for example a few kHz) is first installed behind the photoconductor 60 in order to filter out the low frequency noise. Low-pass filtering with the low-pass filter 110 with a cutoff frequency fG, e.g. within the range of the line width of the lasers (for example, a few MHz), or optionally even more follows thereafter. The measurement bandwidth is thus determined. In doing so it is not important whether the filtering actually takes place via the filter 110 or via the maximum frequency of a possibly following low noise amplifier. The low noise amplifier can for example be expedient for performing a pre-amplification of the frequently very small signals. A better signal to noise ratio is thus achieved. Photodiodes (of different types, e.g. uni-travelling carrier photodiodes) can be used as mixers with the optional high-pass filter.

The thusly band-filtered signal 114 is subsequently rectified by means of a rectifier 120 (e.g. a fast diode or by means of an operational amplifier circuit, also see FIG. 1) so that a positively defined signal 124 results. If the measurement signal 20 is then close to the frequency difference of the lasers and thus within the band filter, a measurable DC signal results from the rectification, in fact regardless of the arbitrary phase φ between the measurement signal 20 and the laser frequency difference fo. If the frequency fs of the measurement signal 20 is too far away from the beat frequency fo of the laser, the low-pass filter filters out the mixed signal (part S in FIG. 2) and only the noise in the selected pass band is measured.

The frequency difference of the lasers can be tuned thereafter and the DC component can thus be accounted for. It is for example possible to use the so-called lock-in method for this, wherefore the signal would be additionally modulated in this case. It is an advantage of this procedure that only one measuring point per frequency difference of the lasers is to be measured (the measuring point corresponds to the detection of the DC signal at a given reference $f_{Lo}$).

This procedure, which agrees with procedure shown in FIG. 2, offers the following advantages:

It is clearly more simple than having to measure and evaluate an RF spectrum in each case. A further advantage results from the fact that only a photomixer 60 is needed instead of a photomixer for THz generation and a detector for mixing.

A further advantage of the example embodiment consists of the fact that the resulting system is essentially compatible with conventional continuous wave photomixing systems and only a small effort is needed for modifying the spectrum analyzer.

Although only a comparatively low frequency resolution, which lies, for example, in the range of the line width of the laser (typically a few MHz) is possibly attainable, example embodiments offer fast and simple tunability. This makes it possible to realize a rapidly operating spectral analyzer.

It is in addition possible to analyze extremely wide-band THz signals.

The noise threshold depends on the material quality of the photoconductor and should lie in the range fW-pW/Hz for frequencies below 1 THz. The noise increases at higher frequencies. However further measurements should nevertheless be possible if the measurement signal is strong enough.

Since continuous wave lasers are very affordable compared with frequency combs, only a THz photo mixer is needed and no RF spectrum analyzers with wide measurement bandwidths are needed, the system is comparatively economical.

Figure 4:
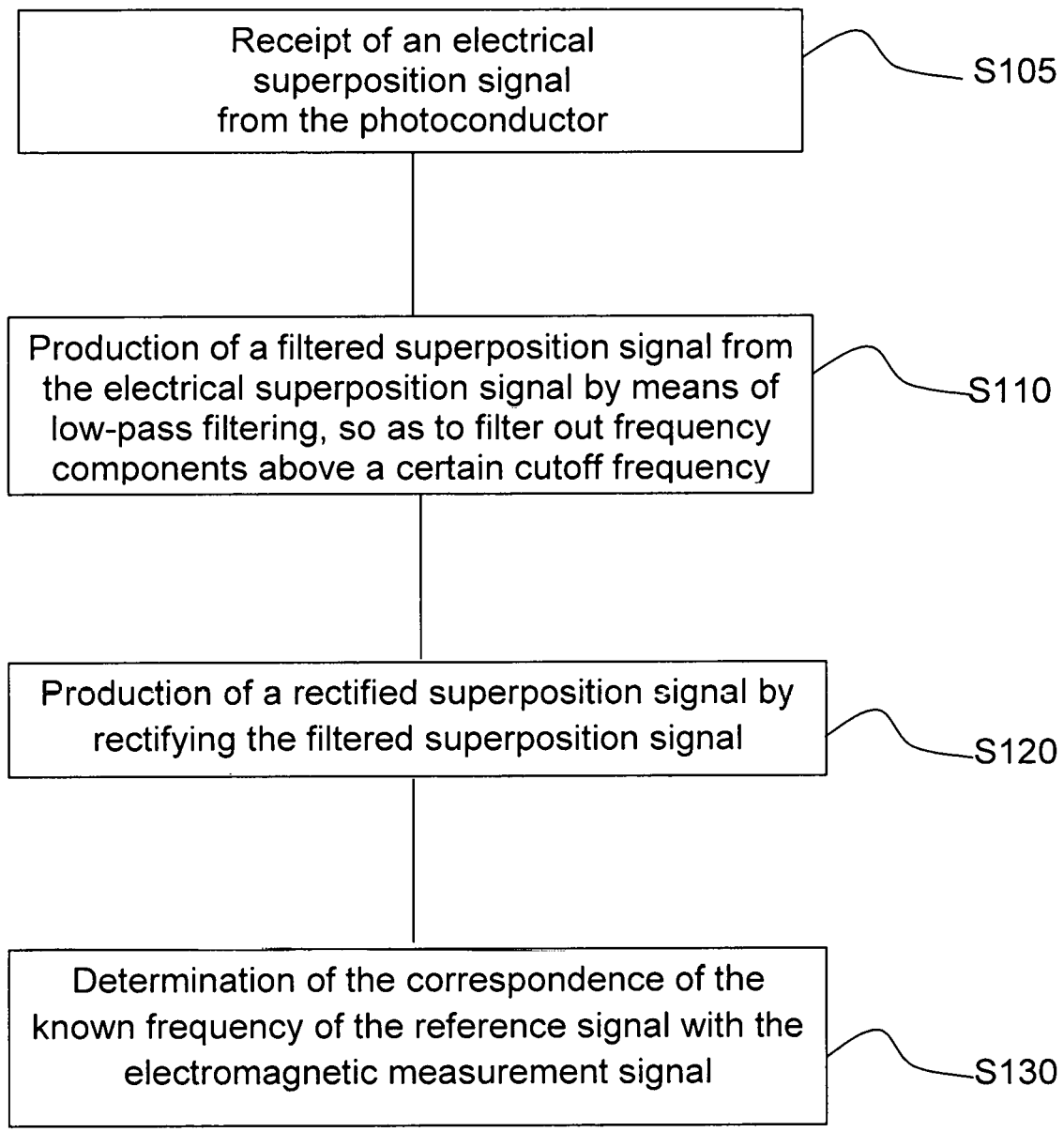
FIG. 4 shows a flow chart of a method for the spectral analysis of the electromagnetic measurement signal in accordance with the subject technology.

FIG. 4 shows a flow chart for a procedure for the spectral analysis of an electromagnetic measurement signal using a photoconductor 60, with the photoconductor being designed to produce the electrical superposition signal 24 by superimposing the electromagnetic measurement signal 20 and a reference signal 40 with at least one known frequency fo. This procedure comprises the following steps: receipt S105 of an electrical superposition signal 24 from the photoconductor 60, production S110 of a filtered superposition signal 114 from the electrical superposition signal 24 by low-pass filtering, so as to filter out frequency fractions above an upper cutoff frequency fG, production S120 of a rectified superposition signal 124 by rectifying a filtered superposition signal 114, and determination S130 of an accordance of the known frequency fo of the reference signal 40 with the electromagnetic measurement signal 20.

All previously described functions of the devices can be implemented in the process as further optional process steps.

The process can be implemented, at least in part, in the form of software on a data processing facility, which makes it possible to control the device 100 and/or the reference signal 30. Additional example embodiments therefore also comprise a storage medium with a computer program stored thereon, which is configured to cause a device to perform the aforesaid process when it runs on a processor (processing unit). The storage medium can be a machine-readable medium, which contains mechanisms for storing and transferring data in a form that is readable by a machine (e.g. a computer). The software-implemented procedure can, for instance, be implemented on a control module with a processor on which the computer program runs.

Important aspects of this invention can be summarized as follows:

Example embodiments relate to a system comprising two continuous wave or quasi-continuous wave laser signals and additionally an ultrafast photoconductor (for example with a charge carrier lifetime of less than 100 ps). The system furthermore comprises a subsequent low-pass filter 110 and a subsequent rectifier 120, as well as read-out electronics 130 for the rectified signal.

In another example embodiment, at least one of the lasers is tunable.

In another example embodiment, the frequency difference of the lasers can be tuned between direct current up to a maximum of 10 THz.

In another example embodiment, an amplifier is inserted after the photoconductor 60 or after the low-pass filter.

In other example embodiments, the low-pass filter 110 is implemented by way of the cutoff frequency of an amplifier.

In other example embodiments, the low-pass filter 110 is tunable.

In other example embodiments, the laser frequency is in the range between 500 and 1700 nm.

In other example embodiments, the measurement signal 20 is additionally modulated and the read-out electronics 130 are based on lock-in technology.

In other example embodiments, the photoconductor 60 has finger contact electrode structures 77, 78 with a distance d of, e.g., less than 20 μm.

In other example embodiments, the photoconductor 60 is coupled to an antenna 70.

In other example embodiments, the photoconductor 60 is affixed to a lens 90.

In other example embodiments, a high-pass filter for filtering low-frequency components is additionally implemented after the photomixer 60 or after the low-pass filter 110 or after the amplifier.

In other example embodiments, the laser signals are produced by a multi-mode laser.

In other example embodiments, a continuous wave frequency comb is used as a laser source 30.

The characteristics of the invention disclosed in the description, the claims and the figures can be essential, both individually and in arbitrary combination, for the implementation of the invention.

REFERENCE SYMBOL LIST

20 Electromagnetic measurement signal
24 Electrical superposition signal
30 Source (reference radiation source)
40 Reference signal
60 Photoconductor
70, 71, 72 Antenna
73, 74 Antenna connectors
77, 78 Finger contacts
80 Ground connection
90 Lens
100 Device for spectral analysis
105 Signal input
110 Low-pass filter
114 Filtered superposition signal
120 Rectifier
124 Rectified superposition signal
130 Read-out unit
220 Frequency shift of a spectral component
fo Reference signal frequency
fs Measurement signal frequency
f1, f2 Laser frequencies
fG Cutoff frequency

The invention claimed is:

1. A spectrum analyzer for an electromagnetic measurement signal, the spectrum analyzer comprising:
   at least one laser source, which is designed to produce a first continuous wave signal with a first frequency and a second continuous wave signal with a second frequency and to combine them into a reference signal, wherein the reference signal is a difference signal of the first continuous wave signal and the second continuous wave signal and the at least one laser source is tunable so as to change the first frequency and/or the second frequency in a predetermined domain, wherein the predetermined domain comprises frequencies from 0 to 10 THz;

an optoelectronic mixer, which is designed to produce an electrical superposition signal through a superposition of the electromagnetic measurement signal and the reference signal,
wherein the optoelectronic mixer is configured as a photoconductor comprising a finger electrode structure with a distance of less than 20 µm between the contact fingers; and
a device for a spectral analysis comprising:
   a signal input for receiving of the electrical superposition signal from the optoelectronic mixer;
   a low-pass filter, which is designed to produce a filtered superposition signal from the electrical superposition signal by filtering out frequency components above an upper cutoff frequency;
   a rectifier, which is designed to create a rectified superposition signal from the filtered superposition signal; and
   a read-out unit, which is designed to determine a correspondence of the known frequency of the reference signal with the electromagnetic measurement signal based on the rectified superposition signal.

2. The spectrum analyzer according to claim 1, which additionally comprises an amplifier, so as to amplify the electrical superposition signal or the filtered superposition signal.

3. The spectrum analyzer according to claim 2, wherein the low-pass filter is part of the amplifier, so that the amplifier has a reduced amplification for signals with frequencies above the cutoff frequency.

4. The spectrum analyzer according to claim 1, wherein the cutoff frequency of the low-pass filter is controllable.

5. The spectrum analyzer according to claim 1, which additionally comprises a lock-in amplifier and/or a modulator, so as to modulate the electrical superposition signal with a signal of known frequency and phase, and wherein the read-out unit is designed to read out the modulated electrical superposition signal based on the lock-in method.

6. The spectrum analyzer according to claim 1, which additionally comprises a high-pass filter, which is designed to filter out frequency components of the electrical superposition signal lying below a lower cutoff frequency, wherein the high-pass filter is located along a signal path before the rectifier and wherein the rectifier particularly comprises a precision rectifier or an operational amplifier circuit.

7. The spectrum analyzer according to claim 1, wherein the upper cutoff frequency of the low-pass filter depends on the line width of the reference signal.

8. The spectrum analyzer according to claim 1, wherein the first laser signal and/or the second laser signal have a wavelength in the range between 500 nm and 1700 nm.

9. The spectrum analyzer according to claim 1, wherein the optoelectronic mixer additionally comprises an antenna for receiving the electromagnetic measurement signal and/or a lens for focusing the electromagnetic measurement signal.

10. The spectrum analyzer according to claim 1, wherein the laser source for producing the first laser signal and the second laser signal is a multimode laser.

11. The spectrum analyzer according to claim 1, wherein the at least one laser source includes a first laser source for generating a first laser signal and a second laser source for generating a second laser signal, wherein the reference signal is a superposition of the first laser signal and the second laser signal.

12. The spectrum analyzer according to claim 1, wherein the optoelectronic mixer is configured as a photoconductor and the device for the spectral analysis is further configured to determine a spectral power of the electromagnetic measurement signal.

13. A method for analyzing an electromagnetic measurement signal by using an optoelectronic mixer, wherein the optoelectronic mixer is configured as a photoconductor comprising a finger electrode structure with a distance of less than 20 µm between the contact fingers, wherein the optoelectronic mixer is designed to produce an electrical superposition signal by means of superposition of the electromagnetic measurement signal and a reference signal with at least one known frequency, wherein the reference signal is generated by at least one laser source by combining a first continuous wave signal with a first frequency and a second continuous wave signal with a second frequency, wherein the at least one laser source is tunable to modify the first frequency or the second frequency so that a frequency difference between the first frequency and the second frequency lies in a range extending up to 10 THz, comprising the following steps:
   receiving of an electrical superposition signal from the optoelectronic mixer;
   generating of a filtered superposition signal out of the electrical superposition signal by means of low-pass filtering so as to filter out frequency components above a cutoff frequency;
   generating of a rectified superposition signal by rectifying the filtered superposition signal; and
   determining of a correspondence of the known reference frequency of the reference signal with the electromagnetic measurement signal.

14. The method according to claim 13, wherein the reference signal comprises a beat of two laser signals produced by one or more laser sources and the method furthermore comprises:
   tuning of at least one of the laser sources until a frequency of a part of the superposition signal is below the cutoff frequency, and
   determining a frequency of the measurement signal.

* * * * *